United States Patent
Kim et al.

(10) Patent No.: US 7,180,764 B2
(45) Date of Patent: Feb. 20, 2007

(54) ONE-TIME PROGRAMMABLE (OTP) MEMORY DEVICES ENABLING PROGRAMMING BASED ON PROTECTED STATUS AND METHODS OF OPERATING SAME

(75) Inventors: Won-kyum Kim, Gyeonggi-do (KR); Yhong-deug Ma, Gyeonggi-do (KR)

(73) Assignee: Samsung Electronics Co., Inc. (KR)

( * ) Notice: Subject to any disclaimer, the term of this patent is extended or adjusted under 35 U.S.C. 154(b) by 0 days.

(21) Appl. No.: 11/173,634

(22) Filed: Jul. 1, 2005

(65) Prior Publication Data

US 2006/0067099 A1    Mar. 30, 2006

(30) Foreign Application Priority Data

Sep. 30, 2004    (KR) ............... 10-2004-0077735

(51) Int. Cl.
*G11C 17/00* (2006.01)
(52) U.S. Cl. ............ 365/94; 365/96; 365/225.7; 327/525
(58) Field of Classification Search ........... 365/94
See application file for complete search history.

(56) References Cited

U.S. PATENT DOCUMENTS

| | | | | |
|---|---|---|---|---|
| 4,887,239 A | * | 12/1989 | Turner | 365/185.04 |
| 5,357,471 A | * | 10/1994 | Alapat | 365/201 |
| 6,182,187 B1 | * | 1/2001 | Cox et al. | 711/5 |
| 6,668,302 B1 | | 12/2003 | Fox | 711/103 |
| 6,690,603 B2 | * | 2/2004 | Matsubara et al. | 365/185.33 |
| 6,728,137 B1 | * | 4/2004 | Lin | 365/185.05 |
| 2002/0062479 A1 | | 5/2002 | Takata | 717/168 |
| 2004/0042274 A1 | * | 3/2004 | Low et al. | 365/189.07 |
| 2004/0049652 A1 | * | 3/2004 | Troutman et al. | 711/219 |
| 2006/0028894 A1 | * | 2/2006 | Brennan et al. | 365/225.7 |
| 2006/0083060 A1 | * | 4/2006 | Riva Reggiori et al. | 365/185.04 |

FOREIGN PATENT DOCUMENTS

KR    1019970005646    4/1997

* cited by examiner

*Primary Examiner*—Son L. Mai
(74) *Attorney, Agent, or Firm*—Myers Bigel Sibley & Sajovec, PA

(57) ABSTRACT

A One-Time Programmable (OTP) memory device can include a first OTP memory cell enabled for programming responsive to protected status associated with a second OTP memory cell configured for programming prior to the first OTP memory cell. Related methods are also disclosed.

19 Claims, 4 Drawing Sheets

ONE-TIME PROGRAMMABLE (OTP) MEMORY DEVICES ENABLING PROGRAMMING BASED ON PROTECTED STATUS AND METHODS OF OPERATING SAME

CROSS-REFERENCE TO RELATED APPLICATION

This application claims the priority of Korean Patent Application No. 10-2004-0077735, filed on Sep. 30, 2004, in the Korean Intellectual Property Office, the disclosure of which is incorporated herein by reference in its entirety.

FIELD OF THE INVENTION

The present invention relates to integrated circuit memory devices, and more particularly, to non-volatile memory devices and associated methods of operation thereof.

BACKGROUND

Non-volatile memory devices are used in electronic products such as digital cameras, cellular phones, video game consoles, and various portable devices. Generally, hard disk drives, flash memories, and One-Time Programmable (OTP) memories are classified as non-volatile memory devices, since stored data is retained when power is removed from the device. Flash memories and OTP memories are widely used types of non-volatile memory. A flash memory or OTP memory stores binary data such as "0" or "1" by controlling a threshold voltage of its memory cells. One difference between flash memory and OTP memory is that data stored in the OTP memory is not updateable, while data stored in the flash memory is. That is, once data is written to a memory cell of an OTP memory, it may be difficult or even impossible to change.

FIG. 1 shows a functional block diagram of a conventional OTP memory 100. For the convenience of description, it is assumed that the OTP memory 100 includes an OTP memory cell 101, a protection cell 102, and a controller 103. The protection cell 102 stores data indicating whether or not the OTP memory 101 has been programmed. For example, data "0" stored in the protection cell 102 indicates that the OTP memory cell 101 has not been programmed, and data "1" stored in the protection cell 102 indicates that the OTP memory cell 101 has been programmed. The controller 103 is electrically connected to the OTP memory cell 101 and the protection cell 102, thus controlling the programming operation of the OTP memory cell 101.

If the OTP memory cell 101 has not been programmed, a buffer of the controller 103 is enabled by the data "0" written in the protection cell 102, so that the OTP memory cell 101 is programmed according to input data X, and output data Y is output. Meanwhile, if the OTP memory cell 101 has been programmed, the buffer of the controller 103 is disabled by the data "1" written in the protection cell 102, so that the input data X is not applied to the OTP memory cell 101 and data programmed in the OTP memory cell 101 is output as output data Y.

As such, since the OTP memory cell 101 may not be updateable once it is programmed, if a value programmed in the OTP memory cell 101 is not a desired value, the OTP memory 100 may be discarded. Further, when the OTP memory 100 is part of a complete product, such as an LCD module, if unsuitable programmed data is stored in the OTP memory 100, then the entire LCD module may need to be discarded, as well as the driver IC in which the OTP memory 100 is installed.

SUMMARY

Embodiments according to the invention can provide One-Time Programmable (OTP) memory devices enabling programming based on protected status and methods of operating same. In some embodiments according to the invention, an OTP memory device includes a first OTP memory cell enabled for programming responsive to protected status associated with a second OTP memory cell configured for programming prior to the first OTP memory cell.

In some embodiments according to the invention, the first OTP memory cell is enabled for programming if the protected status associated with the second OTP memory cell indicates a high logic level stored therein. In some embodiments according to the invention, the OTP memory device further includes a protection cell associated with the second OTP memory cell and is separate therefrom. In some embodiments according to the invention, a low logic level stored in the second OTP memory cell provides enables programming of the first OTP memory cell.

In some embodiments according to the invention, the second OTP memory cell further includes a plurality of second OTP memory cells configured for programming prior to the first OTP memory cell, wherein any of the plurality second OTP memory cells being programmed to a logic high level provides the protected status to enable programming of the first OTP memory cell.

In some embodiments according to the invention, the first OTP memory cell further includes a plurality of first OTP memory cells enabled for programming responsive to the protected status provided by any of the plurality of second OTP memory cells. In some embodiments according to the invention, the second OTP memory cell is disabled from further programming responsive to the protected status enabling programming of the first OTP memory cell.

In some embodiments according to the invention, the OTP memory device further includes an output buffer coupled to an output of the second OTP memory cell configured to disable output of data stored therein responsive to the protected status enabling programming of the first OTP memory cell. In some embodiments according to the invention, the OTP memory device further includes an output buffer coupled to an output of the first OTP memory cell configured to enable output of data stored therein responsive to the protected status enabling programming of the first OTP memory cell.

In some embodiments according to the invention, an OTP memory device includes a plurality of OTP memory cells and protection cells in which the states of the plurality of OTP memory cells are written. Input controllers are connected respectively to OTP memory blocks, each including one of the OTP memory cells and a protection cell corresponding to that OTP memory cell, which control the programming of the OTP memory cells so that the OTP memory cells in each OTP memory block are sequentially programmed in response to a reset signal.

In some embodiments according to the invention, a method of programming a One-Time Programmable (OTP) memory device includes enabling a first OTP memory cell for programming responsive to protected status associated with a second OTP memory cell configured for programming prior to the first OTP memory cell. In some embodiments according to the invention, enabling includes enabling the first OTP memory cell for programming if the protected status associated with the second OTP memory cell indicates a high logic level stored therein.

In some embodiments according to the invention, the protection status is provided by a protection cell associated with the second OTP memory cell separate therefrom. In some embodiments according to the invention, enabling includes providing a low logic level stored in the second OTP memory cell to enable programming of the first OTP memory cell.

In some embodiments according to the invention, the second OTP memory cell includes a plurality of second OTP memory cells configured for programming prior to the first OTP memory cell, and the method further includes providing the protected status to enable programming of the first OTP memory cell responsive to any of the plurality second OTP memory cells being programmed to a logic high level.

In some embodiments according to the invention, the first OTP memory cell includes a plurality of first OTP memory cells and the method further includes enabling the plurality of first OTP for programming responsive to the protected status provided by any of the plurality of second OTP memory cells. In some embodiments according to the invention, the method further includes disabling the second OTP memory cell from further programming responsive to the protected status enabling programming of the first OTP memory cell.

In some embodiments according to the invention, an OTP memory device includes a plurality of OTP memory cells programmable via a common memory address configured for multiple programming operations.

In some embodiments according to the invention, the method further includes disabling output of data stored in the second OTP memory cell responsive to the protected status enabling programming of the first OTP memory cell. In some embodiments according to the invention, the method further includes enabling output of data stored in the first OTP memory cell responsive to the protected status enabling programming of the first OTP memory cell.

Figure 1:
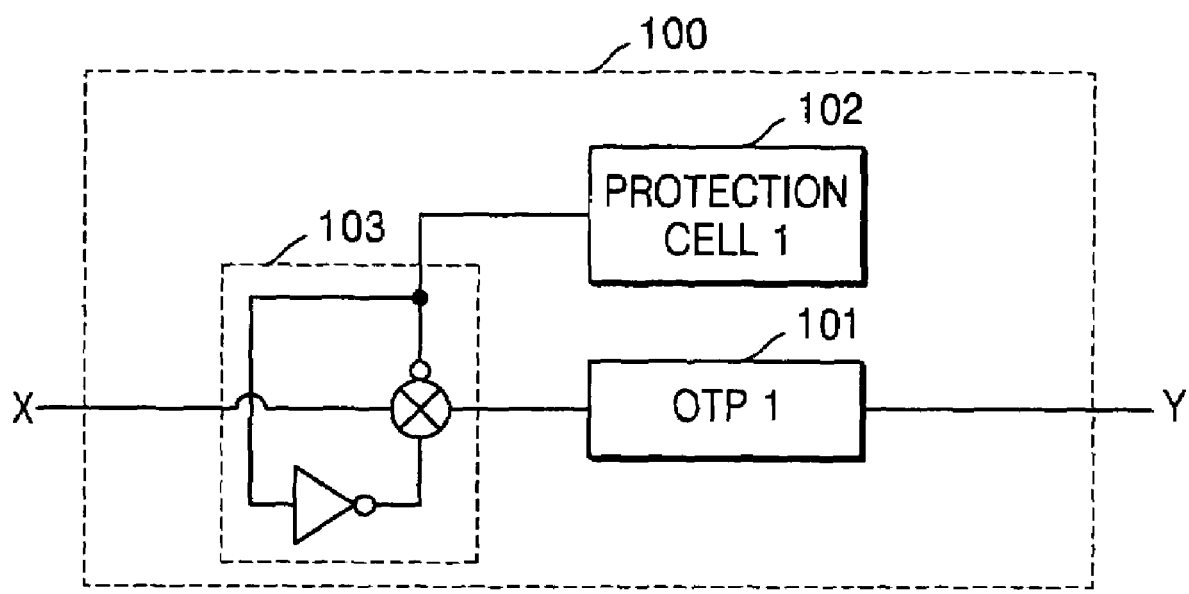
FIG. 1 is a functional block diagram of a conventional OTP memory.

DESCRIPTION OF EMBODIMENTS
ACCORDING TO THE INVENTION

The invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
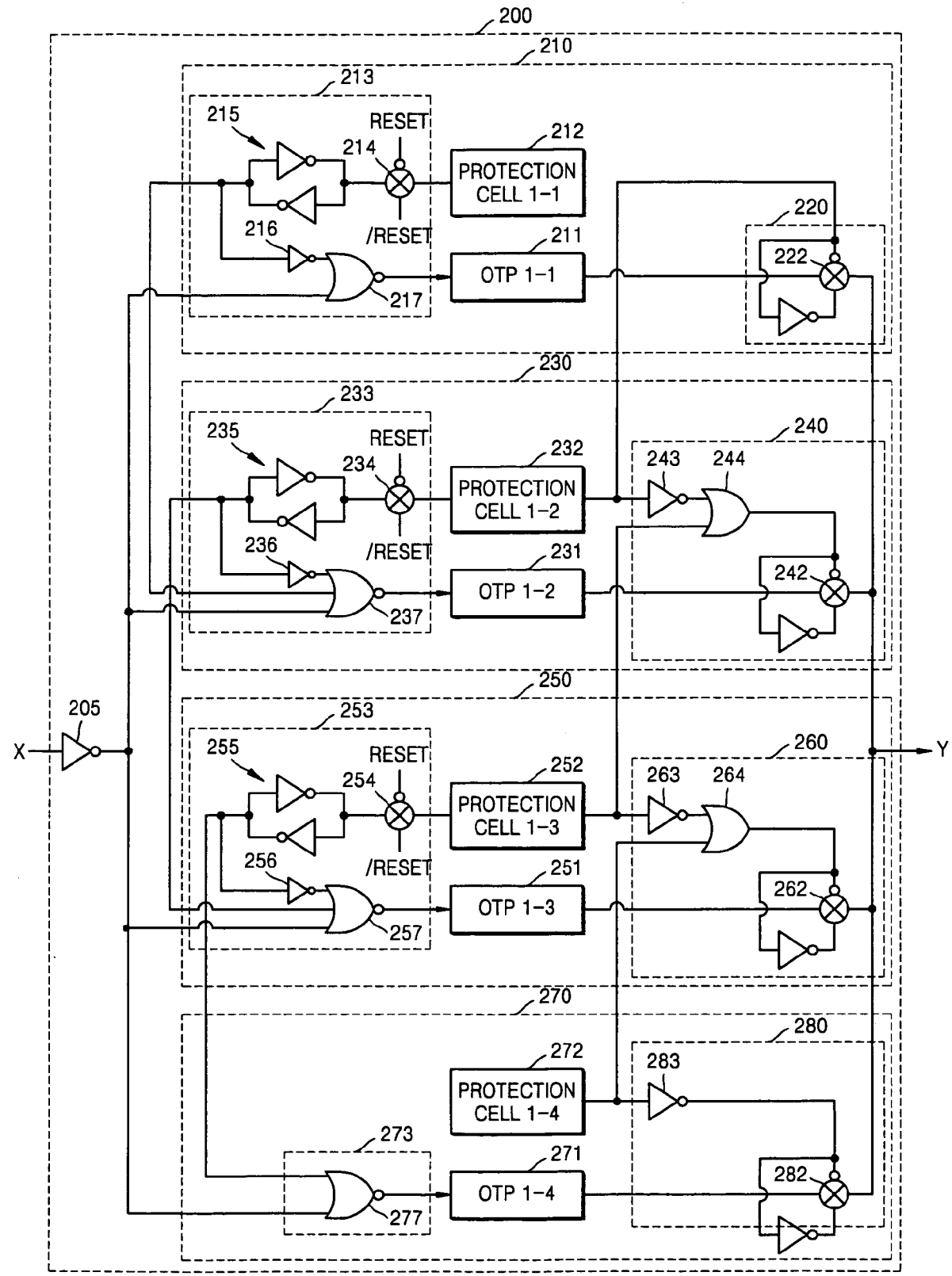
FIG. 2 shows an OTP memory device in some embodiments according to the present invention.

FIG. 2 shows an OTP memory device 200 according to some embodiments of the present invention. Referring to FIG. 2, the OTP memory device 200 includes an inverter 205 for inverting an input signal X, an output terminal for outputting an output signal Y, and a plurality of OTP memory blocks 210, 230, 250, and 270 located between an output terminal of the inverter 205 and the output terminal. The plurality of OTP memory blocks 210, 230, 250, and 270 are sequentially programmed in response to the input signal X, and the one which was programmed last is connected to the output terminal. The OTP memory blocks 210, 230, 250, and 270 respectively include OTP memory cells 211, 231, 251, and 271, protection cells 212, 232, 252, and 272, input controllers 213, 233, 253, and 273, and output controllers 220, 240, 260, and 280. In this specification, for convenience of description, it is assumed that the OTP memory device 200 includes four OTP memory blocks 210, 230, 250, and 270.

The first OTP memory block 210 includes a first OTP memory cell 211 which is programmed in response to an input signal X, a first protection cell 212 in which the state of the first OTP memory cell 211 is written, a first input controller 213 for controlling the programming of the first OTP memory cell 211 in response to reset signals RESET and /RESET and data of the first protection cell 212, and a first output controller 220 for controlling the output of data of the first OTP memory cell 211 as an output signal Y.

The first input controller 213 includes a buffer unit 214 for transmitting data of the first protection cell 212 to the a latch unit 215 for latching data of the first protection cell 212, in response to the reset signals RESET and /RESET, a first inverter 216 for inverting data stored in the first latch unit 215, and a NOR gate 217 for receiving an output of the first inverter 216 and an inverted signal /X of the input signal X. When the first OTP memory cell 211 has not been programmed, initial data "0" is written in the first protection cell 212. The data "0" written in the first protection cell 212 is transmitted to the first latch unit 215 through the first buffer unit 214, in response to a logic low level of the reset signal RESET. The first latch unit, receiving the data "0", outputs data "1" which is inverted to data "0" by the first inverter 216. The data "0" output from the first inverter 216 is transferred to the first NOR gate 217, thus enabling the first NOR gate 217. The first NOR gate 217 receives an inverted signal /X of the input signal X, inverts the inverted signal /X, and transfers the result to the first OTP memory cell 211. Then, the reset signal RESET changes to a logic high level and the first OTP memory cell 211 is programmed in response to the input signal X.

Meanwhile, the data "1" output from the first latch unit 215 is provided to a second NOR gate 237 in the second OTP memory block 230, thus disabling the second NOR gate 237. Accordingly, the inverted input signal /X is not input to the second NOR gate 237, preventing the programming operation of the second OTP memory cell 231. At this time, data written in the second protection cell 232 is "0" since the second OTP memory cell 231 has not been programmed. Due to the data "0" written in the second protection cell 232, the output of the second latch unit 235 becomes data "1". This disables a third NOR gate 257, thus preventing the inverted input signal /X from being input to the third NOR gate 257. Thus, the programming of the third OTP memory cell 251 is stopped. Since the third OTP memory cell 251 has not been programmed, the third protection cell 252 maintains data "0". Due to the data "0" written in the third protection cell 252, the third latch unit 255 outputs data "1". The data "1" output from the third latch unit 255 disables the fourth NOR gate 277, thus preventing the inverted input signal /X from being input to the fourth NOR gate 277. Thus, the programming of the fourth OTP memory cell 271 is stopped. That is, while the first OTP memory cell 211 of the first OTP memory block 210 is programmed, the second through fourth OTP memory blocks 230, 250, and 270 are not programmed.

The first output controller 220 includes a buffer unit 222 for outputting, as an output signal Y, data of the first OTP memory cell 211 programmed in response to data of the second protection cell 232 in the second OTP memory block 230. The data of the second protection cell 232 is maintained as data "0" since the second OTP memory cell 231 has not been programmed. The data of the first OTP memory cell 211 is output as the output signal Y through the buffer unit 222, enabled by the data "0" of the second protection cell 232.

Also, the data "0" of the second protection cell 232 is provided to the second output controller 240, thus preventing the data of the second OTP memory cell 231 from being output as the output signal Y. The second output controller 240 includes an inverter 243 which receives data of the second protection cell 232, an OR gate 244 which receives outputs of the inverter 243 and data "0" of the third protection cell 252, and a buffer unit 242 which outputs data of the second OTP memory cell 231 as an output signal in response to the output of the OR gate 244. The output of the inverter 244 changes to data "1" in response to the data "0" of the first protection cell 232, thus disabling the buffer unit 242. Accordingly, the data of the second OTP memory cell 231 is no longer output as the output signal Y. Likewise, the output of the inverter 263 changes to data "1" in response to the data "0", and accordingly the buffer unit 262 is disabled, so that the data of the third OTP memory cell 251 is no longer output as the output signal Y. That is, while the data of the first OTP memory cell 211 of the first OTP memory block 210 is read as the output signal Y, the data of the second through fourth OTP memory blocks 230, 250, and 270 is not read.

As described above, in some embodiments according to the invention, when the first OTP memory cell 211 is programmed, data "1" is written in the first protection cell 212. If data programmed in the first OTP memory cell 211 is incorrect or needs updating, new data is programmed in the second OTP memory cell 231 of the second OTP memory block 230 instead of the first OTP memory cell 211.

In some embodiments according to the invention, to program the new data in the second OTP memory cell 231, first, a reset signal RESET changes to a logic low level. Data "1" of the first protection cell 212 is transferred to the first latch unit 215 through the first buffer unit 214 in response to the logic low level of the reset signal RESET. The first latch unit 215 outputs data "0", which is inverted to data "1" by the first inverter 216, and the data "1" disables the NOR gate 217. Accordingly, since the inverted input signal /X is no longer input to the first NOR gate 217, the programming of the first OTP memory cell 211 is stopped. As described above, programming of the third and fourth OTP memory blocks 250 and 270 is stopped.

Data "0" of the second protection cell 232 is transferred to the second latch unit 235 through the second buffer unit 234 in response to the logic low level of the reset signal RESET. Then, the second latch unit 235 outputs data "1", which is inverted to data of "0" by the second inverter 236, and the data "0" is transmitted to the second NOR gate 237. The second NOR gate 237 is enabled in response to the data "0" received from the second inverter 236 and the data "0" received from the second latch unit 235. The second NOR gate 237 receives an inverted signal /X of the input signal X, inverts the inverted signal /X, and transfers the result to the second OTP memory cell 231. Then, the reset signal RESET changes to a logic high level and the second OTP memory cell 231 is programmed in response to the input signal X. Since the second OTP memory cell 231 is programmed, data "1" is written in the second protection cell 232.

The buffer unit 222 of the first output controller 220 is disabled in response to the data "1" written in the second protection cell 232, so that the data of the first OTP memory cell 211 is no longer output as the output signal Y. The buffer unit 242 of the second output controller 240 is enabled in response to the data "1" received from the second protection cell 232 and the data "0" received from the third protection cell 252, thus outputting the data of the second OTP memory cell 231 as the output signal Y. Also, the third output controller 260 and the fourth output controller 280 respectively prevent data of the third and fourth OTP memory cells 251 and 271 from being output as the output signal Y, in response to the data "0" of the third and fourth protection cells 252 and 272. That is, while the data of the second OTP memory cell 231 of the second OTP memory block 230 is read as the output signal Y, the reading operations for the first, third, and fourth OTP memory blocks 210, 250, and 270 are stopped.

Accordingly, in some embodiments according to the invention, while the third OTP memory cell of the third OTP memory block 250 is programmed, programming of the remaining OTP memory blocks 210, 230, and 270 is stopped. Likewise, while the fourth OTP memory block 270 is programmed, programming if the remaining OTP memory block 210, 230, and 250 is stopped.

Accordingly, in some embodiments according to the invention, since the OTP memory device 200 includes four OTP memory blocks 210, 230, 250, and 270, the OTP memory device 200 can be programmed four times. It is possible to include a plurality of OTP memory blocks in the OTP memory device 200 and allow multiple programming up to the number of OTP memory blocks included. Also, in the present embodiment, the reset signals RESET and /RESET for sequentially programming the OTP memory blocks 210, 230, 250, and 270 are provided from an external source. The reset signals RESET and /RESET can be used as test signals of the OTP memory device 200. Furthermore, OTP memory cells 211, 231, 251, and 271 are commonly addressable using the same memory address to store/retrieve data provided via X or Y.

Figure 3:
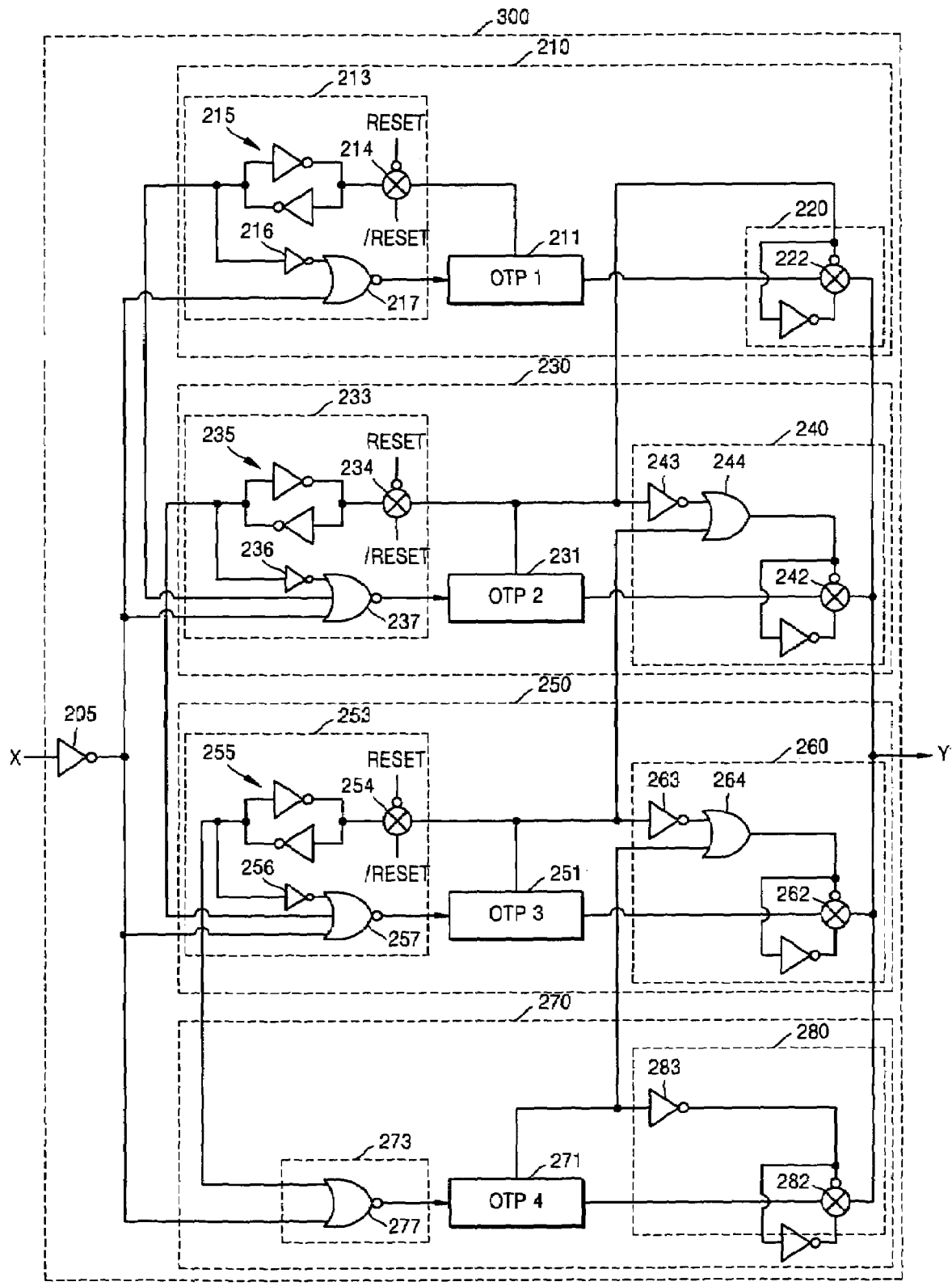
FIG. 3 shows an OTP memory device in some embodiments according to the present invention.

FIG. 3 shows an OTP memory device 300 according to some embodiments of the present invention. Referring to FIG. 3, the OTP memory device 300 may not include separate protection cells, compared to the OTP memory device 200 of FIG. 2. However, both may allow the sequential programming of the first through fourth OTP memory cells 211, 231, 251, and 271. The OTP memory device 300 also differs in that the OTP memory cells 211, 231, 251, and 271 which have been programmed with data "0" in response to an input signal X of data "0", can be re-programmed to data "1" according to an input signal X of data "1".

For example, the third OTP memory cell 251 is programmed only once the first and second OTP memory cells 211 and 231 have already been programmed with data "1". The data "1" of the first OTP memory cell 211 is input to the first NOR gate 217 through the first buffer unit 214, the first latch unit 215, and the first inverter 216, in response to a logic low level of the reset signal RESET, thus disabling the first NOR gate 217. Also, the data "1" of the second OTP memory cell 231 is input to the second NOR gate 237 through the second buffer unit 234, the second latch unit 235, and the second inverter 236, in response to the logic low level of the reset signal RESET, thus disabling the second NOR gate 237.

The third OTP memory cell 251 which is not programmed is recognized to have data "0". This data is input to the third NOR gate 257 through the third buffer unit 254, the third latch unit 255, and the third inverter 256, and the data "0" output from the second latch unit 235 is input to the third NOR gate 257, thus enabling the third NOR gate 257. Accordingly, the third NOR gate receives an inverted input signal /X, inverts the inverted input signal /X, and transfers the result to the third OTP memory cell 251. Then, the reset signal RESET changes to a logic high level and the third OTP memory cell 251 is programmed in response to an input signal X. Meanwhile, data "1" output from the third latch unit 255 is input to the fourth NOR gate 277, thus disabling the fourth NOR gate 277.

If the third OTP memory cell 251 is programmed by an input signal X with data "1", no further programming of that cell is performed, as with the first and second OTP memory cells 211 and 231 which have been programmed with data "1". However, if the third OTP memory cell 251 is programmed by an input signal X with data "0", the third OTP memory cell 251 can be re-programmed by another input signal X since it is in a state which allows further programming.

Figure 4:
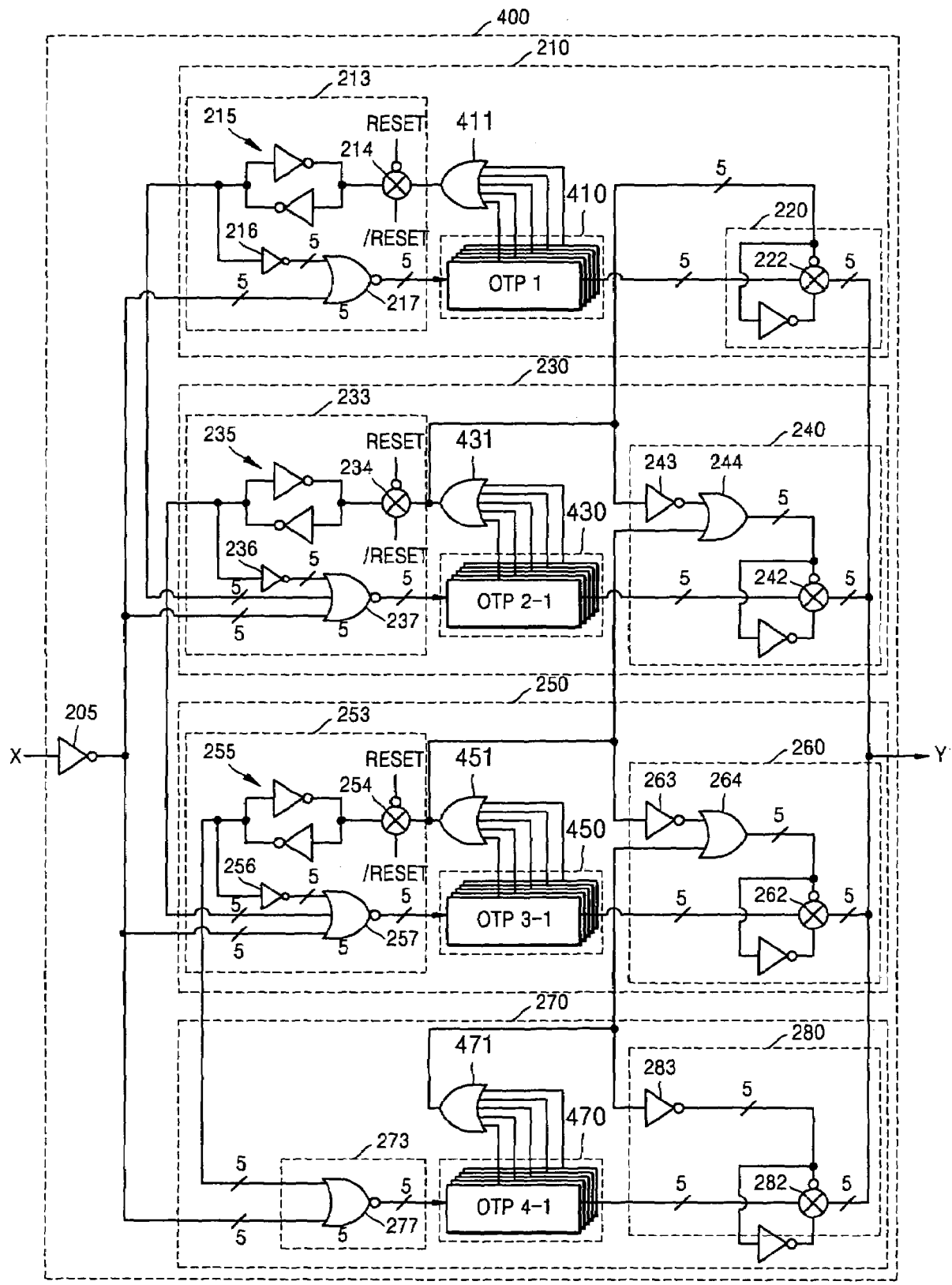
FIG. 4 shows an OTP memory device in some embodiments according to the present invention.

FIG. 4 shows an OTP memory device 500 according to some embodiments of the present invention. Referring to FIG. 4, the OTP memory device 500 differs from the OTP memory device 300 of FIG. 3 in that instead of the first through fourth OTP memory cells 211, 231, 251, and 271, the OTP memory device 500 includes first through fourth OTP memory cell arrays 410, 430, 450, and 470 each including five OTP memory cells, and first through fourth OR gates 411, 431, 451, and 471 connected respectively to the OTP memory cells in the first through fourth OTP memory cell arrays 410, 430, 450, and 470.

The OTP memory cells in the first through fourth OTP memory cell arrays 410, 430, 450, and 470 can operate in the same manner as the first through fourth OTP memory cells 211, 231, 251, and 271 described above with reference to FIG. 3. For example, if data "1" is programmed in one of the five OTP memory cells in the second OTP memory cell array 430, programming of the second OTP memory cell array 430 is stopped and programming of the third OTP memory cell array 450 starts. That is, data "1" written in at least an OTP memory cell of the second OTP memory cell array 430 should be used for the following programming operation. As a result, the second OTP memory cell array 430 can program the five OTP memory cells $31(=2^5-1)$ times.

Therefore, the OTP memory device according to the present invention may allow multiple programming of data to a memory address in an OTP memory. For example, in some embodiments according to the invention, an OTP memory device includes a first OTP memory cell enabled for programming responsive to protected status associated with a second OTP memory cell configured for programming prior to the first OTP memory cell.

Embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed:

1. A One-Time Programmable (OTP) memory device comprising:
   a first OTP memory cell enabled for programming responsive to protected status associated with a second OTP memory cell configured for programming prior to the first OTP memory cell.

2. An OTP memory device according to claim 1 wherein the first OTP memory cell is enabled for programming if the protected status associated with the second OTP memory cell indicates a high logic level stored therein.

3. An OTP memory device according to claim 2 further comprising:
   a protection cell associated with the second OTP memory cell and is separate therefrom.

4. An OTP memory device according to claim 2 wherein a low logic level stored in the second OTP memory cell disables programming of the first OTP memory cell.

5. An OTP memory device according to claim 1 wherein the second OTP memory cell further comprises:
   a plurality of second OTP memory cells configured for programming prior to the first OTP memory cell, wherein any of the plurality second OTP memory cells being programmed to a logic high level provides the protected status to enable programming of the first OTP memory cell.

6. An OTP memory device according to claim 5 wherein the first OTP memory cell further comprises:
   a plurality of first OTP memory cells enabled for programming responsive to the protected status provided by any of the plurality of second OTP memory cells.

7. An OTP memory device according to claim 1 wherein the second OTP memory cell is disabled from further programming responsive to the protected status enabling programming of the first OTP memory cell.

8. An OTP memory device according to claim 1 further comprising:
   an output buffer coupled to an output of the second OTP memory cell configured to disable output of data stored therein responsive to the protected status enabling programming of the first OTP memory cell.

9. An OTP memory device according to claim 1 further comprising:
   an output buffer coupled to an output of the first OTP memory cell configured to enable output of data stored therein responsive to the protected status enabling programming of the first OTP memory cell.

10. A method of programming a One-Time Programmable (OTP) memory device comprising:
    enabling a first OTP memory cell for programming responsive to protected status associated with a second OTP memory cell configured for programming prior to the first OTP memory cell.

11. A method according to claim 10 wherein enabling comprises enabling the first OTP memory cell for programming if the protected status associated with the second OTP memory cell indicates a high logic level stored therein.

12. A method according to claim 11 wherein the protection status is provided by a protection cell associated with the second OTP memory cell separate therefrom.

13. A method according to claim 11 wherein enabling comprises providing a low logic level stored in the second OTP memory cell to disable programming of the first OTP memory cell.

14. A method according to claim 10 wherein the second OTP memory cell comprises a plurality of second OTP memory cells configured for programming prior to the first OTP memory cell, the method further comprising:
    providing the protected status to enable programming of the first OTP memory cell responsive to any of the plurality second OTP memory cells being programmed to a logic high level.

15. A method according to claim 14 wherein the first OTP memory cell comprises a plurality of first OTP memory cells, the method further comprising:
    enabling the plurality of first OTP for programming responsive to the protected status provided by any of the plurality of second OTP memory cells.

16. A method according to claim 10 further comprising:
    disabling the second OTP memory cell from further programming responsive to the protected status enabling programming of the first OTP memory cell.

17. A method according to claim 10 further comprising:
    disabling output of data stored in the second OTP memory cell responsive to the protected status enabling programming of the first OTP memory cell.

18. A method according to claim 10 further comprising:
    enabling output of data stored in the first OTP memory cell responsive to the protected status enabling programming of the first OTP memory cell.

19. A One-Time Programmable (OTP) memory device comprising:
    a plurality of OTP memory cells;
    protection cells in which the states of the plurality of OTP memory cells are written; and
    input controllers, connected respectively to OTP memory blocks, each including one of the OTP memory cells and a protection cell corresponding to that OTP memory cell, which control the programming of the OTP memory cells so that the OTP memory cells in each OTP memory block are sequentially programmed in response to a reset signal.

* * * * *